United States Patent [19]

Malinowski et al.

[11] 4,438,412
[45] Mar. 20, 1984

[54] OSCILLATOR FREQUENCY CONTROL LOOP

[75] Inventors: Christopher W. Malinowski; Heinz Rinderle, both of Heilbronn, Fed. Rep. of Germany

[73] Assignee: Telefunken electronic GmbH, Heilbronn, Fed. Rep. of Germany

[21] Appl. No.: 346,994

[22] Filed: Feb. 8, 1982

Related U.S. Application Data

[63] Continuation of Ser. No. 85,333, Oct. 16, 1979, abandoned.

[30] Foreign Application Priority Data

| Oct. 16, 1978 | [DE] | Fed. Rep. of Germany | 2844936 |
| Oct. 16, 1978 | [DE] | Fed. Rep. of Germany | 2844939 |
| Oct. 16, 1978 | [DE] | Fed. Rep. of Germany | 2844938 |
| Oct. 16, 1978 | [DE] | Fed. Rep. of Germany | 2845005 |
| Oct. 16, 1978 | [DE] | Fed. Rep. of Germany | 2845006 |

[51] Int. Cl.³ .............................................. H03L 7/16
[52] U.S. Cl. ......................................... 331/2; 331/25; 332/19
[58] Field of Search ................... 331/1 R, 2, 9, 11, 12, 331/18, 25; 332/19; 455/256, 260

[56] References Cited

U.S. PATENT DOCUMENTS

| 2,720,133 | 10/1955 | Morgan | 331/11 X |
| 3,087,121 | 4/1963 | Bell | 331/11 |
| 3,416,082 | 12/1968 | Clerc | 324/79 |
| 3,758,865 | 9/1973 | McKibben | 331/1 R X |
| 4,207,539 | 6/1980 | Minakuchi | 331/25 X |

FOREIGN PATENT DOCUMENTS

| 1595409 | 7/1970 | France . |
| 2276731 | 1/1976 | France . |
| 1047857 | 11/1966 | United Kingdom . |
| 1412718 | 11/1975 | United Kingdom . |

OTHER PUBLICATIONS

Hamaoui, "Analog Multiplier/Divider Simplifier Frequency Locking", Electronics, Jul. 5, 1973, pp. 99,100.
"Voltage-to-Frequency Converters: Versatility Now at a Low Cost", by Eugene L. Zuch, Data Systems Inc., Electronics, 5/15/75, pp. 91-95.
"A Novel Frequency-Processing Method and its Implications on Future Tuning System", by Malinowski et al., 8087 IEEE Trans. on Consumer Electronics, vol. CE-25, No. 4, published Aug. 1979, pp. 649-669.

Primary Examiner—Siegfried H. Grimm
Attorney, Agent, or Firm—Spencer & Frank

[57] ABSTRACT

In a circuit arrangement including at least one control loop composed of a controllable oscillator for producing an a.c. output signal whose frequency is a function of the value of a control signal thereto, a frequency/d.c. signal converter connected for producing a d.c. output signal which is a function of the frequency of the oscillator output signal, and a signal comparator having two inputs and an output, with one comparator input receiving a signal corresponding in value to the converter output signal, and the oscillator receiving a control signal corresponding to the signal at the comparator output, the circuit arrangement further including an a.c. signal source, and a second frequency/d.c. signal converter connected for producing a d.c. output signal which is a function of the frequency of the a.c. signal produced by the source, with the other comparator input receiving a signal corresponding in value to the second converter output signal. An adjustable signal control arrangement is connected between the output of the second converter and its associated comparator input for applying to the associated comparator input a signal which differs in value from and varies in proportion with the output signal from the second converter.

7 Claims, 22 Drawing Figures

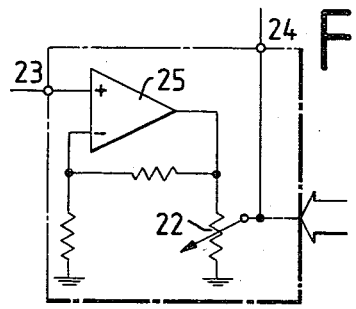
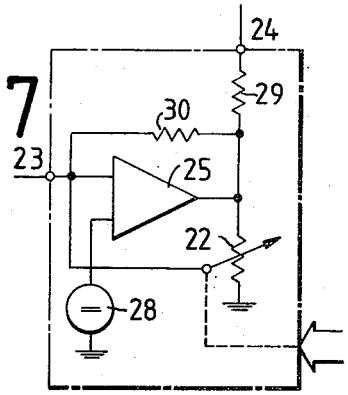
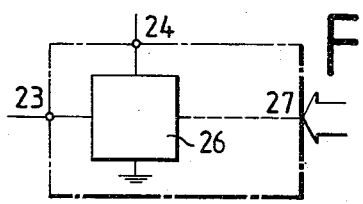
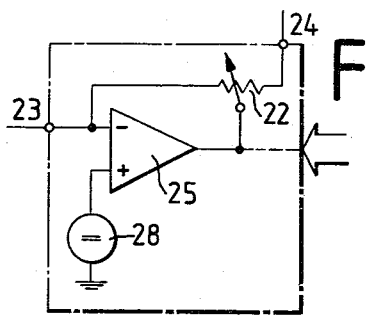
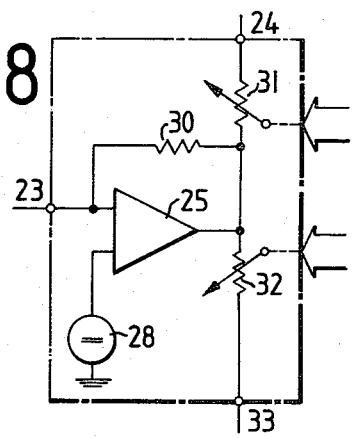
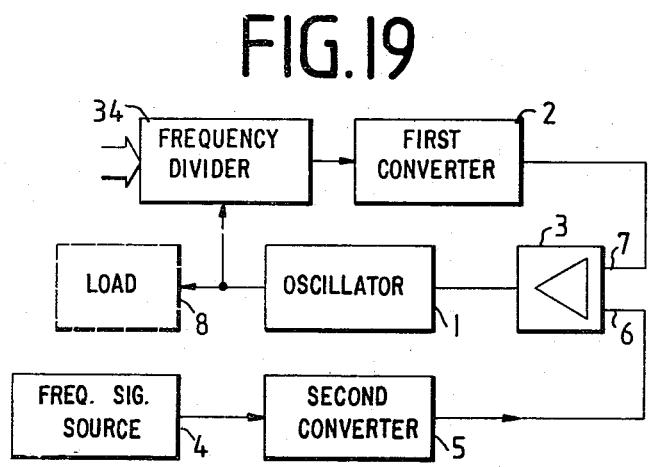

OSCILLATOR FREQUENCY CONTROL LOOP

CROSS-REFERENCE TO RELATED APPLICATION

This application is a continuation of application Ser. No. 06/085,333, filed Oct. 16th, 1979 and now abandoned.

In principle, closed control loops can be grouped into two categories, i.e. loops which operate only with d.c. signals and loops which operate with d.c. signals as well as with alternating signals. Although both categories employ the feedback principle in which the output signal is compared with a desired signal and the resulting signal is used to control the signal source, considerable differences exist between the two categories with respect to the type of signal employed.

The present invention relates to the second category, i.e. to loops in which both types of signals (d.c. and alternating signals) occur. This category can again be divided into two subgroups, which differ with respect to the type of signal processing. The first subgroup analyzes the phase of the alternating signal to obtain the information for the control loop. In this system, the d.c. signal required to control the control loop is derived by means of a phase comparison of the alternating signals. This control signal thus depends only on the phase difference between input signal and reference signal. Such a concept is known by the name "phase locked loop" (PLL system). Such systems are used, for example, for frequency synthesis.

The second subgroup of the second category relates to arrangements in which the frequency of an alternating signal is analyzed or the control signal for the loop is obtained from the frequency of the alternating signal with the aid of a frequency/d.c. signal converter (F/DC converter). In certain arrangements, the input frequency may be the result of an arithmetic linkage of various frequencies, particularly that of the regulated frequency and the reference frequency. In other arrangements, the input frequency signal is furnished directly by the regulated source or is obtained by division of the frequency of the source signal. The d.c. output signal of the converter can be compared in this way with any other d.c. reference signal and can then be used to regulate the frequency of the alternating signal source of the loop.

Arrangements of the above-described type and their use are known. Such arrangements serve, for example, to linearize the control voltage/frequency characteristic of voltage controlled oscillators in which the output frequency signal of the voltage controlled oscillator (VCO) is fed back to the input of the frequency/voltage converter. The output voltage of the frequency/voltage converter, which is proportional to the input frequency, is compared by means of a comparator with a reference voltage. The output signal of the comparator regulates the frequency of the voltage controlled oscillator.

A frequency control loop includes, for example, an oscillator, a frequency/d.c. signal converter and a comparator and these components are connected into a loop. The frequency signal generated by the oscillator is fed to the converter which generates from this frequency signal a d.c. signal which may be a direct voltage or a direct current. A direct voltage generated, for example, at the output of the converter is fed to the one input of the comparator. The second input of the comparator receives an external control voltage for controlling the loop thereby determining the frequency of the loop. Such a frequency control loop has the advantage compared to a controlled oscillator without loop, i.e. without additional converter and comparator, that a frequency is generated which does not change upon a change in the characteristic of the oscillator and thus remains stable during changes in characteristic of the oscillator.

When a control voltage different from the direct voltage generated by the converter is applied to the second input of the comparator, a direct voltage is generated at the output of the comparator which voltage corresponds to the difference of the two input voltages at the comparator. The frequency control loop now has a tendency to reduce the difference voltage present across the comparator input. This is done in that the output voltage of the comparator controls the frequency of the oscillator in such a manner that such a direct voltage change occurs at the output of the converter that the converter output voltage adapts itself to the external control voltage fed to the comparator. This adaptation process takes place until the difference between the two voltages approaches zero. The then resulting frequency is then determined only by the characteristic of the converter while changes in frequency determining resonant circuit elements in the oscillator are of no significance since the control loop automatically corrects such changes.

However, the known frequency control loops which include an oscillator, a converter and a comparator, have drawbacks which originate essentially from the converter properties. Frequency/d.c. signal converters are known to change their characteristic (ratio of d.c. signal to frequency) in dependence on the external operating conditions such as temperature and operating voltage. Moreover, there exist problems in such converters regarding the linearity between the change in frequency and the output signal. The elimination of these drawbacks is possible today only at considerable expense.

It is therefore the object of the invention to provide a circuit arrangement with control loop which does not have the above-listed drawbacks and which can be manufactured economically.

This is accomplished according to the invention in a circuit arrangement including a control loop which employs a frequency/d.c. signal converter and furnishes a signal at a certain frequency in dependence on a control signal in that there is provided a second frequency/d.c. signal converter and a frequency signal source for this second converter and that the second frequency/d.c. signal converter is connected between this frequency signal source and the comparator of the control loop.

The frequency signal source and the second converter serve, so to speak, as the control path which furnishes the control signal for the control loop or from whose output signal is derived the control signal for the control loop (by amplification or attenuation). If a d.c. signal is mentioned here, this is understood to mean a direct voltage or a direct current.

Generally, a frequency control loop should generate not only a single frequency but it should also be able to furnish signals at different frequencies. Since a certain control signal in a single frequency control loop can generate only one frequency, it is necessary to have variable control signals for the control loop if the frequency to be generated is to be changed. In the case of the invention, the control signal source for the control loop is the control path including the frequency signal source and the second frequency/d.c. signal converter or the second frequency/d.c. signal converter controlled by the frequency signal source, respectively. As already expressed above, the control signal furnished by this control path can, however, still be attenuated or amplified.

Different control signals for the control loop can be generated in different ways with the aid of the control path including the frequency signal source and the second converter. One way is, for example, the use of a variable frequency signal source and to vary only the frequency of these signals. Or there exists the possibility of amplifying or attenuating the signal furnished by the variable frequency signal source which has been converted into a d.c. signal by the second converter. There exists the further possibility of using a frequency signal source with constant frequency (e.g. a quartz oscillator) and to vary correspondingly by attenuation or amplification the d.c. signal produced by the second converter from the frequency signal of such a signal source. For a direct voltage, for example, signal attenuation is realized by means of a passive voltage divider or by active voltage division in an amplifier arrangement, while signal amplification is effected in an amplifier.

FIGS. 2–7 and 19–22 are block circuit diagrams of embodiments of circuit arrangements according to the invention.

FIGS. 8–18 are circuit diagrams of components of circuit arrangements according to the invention.

Figure 1:
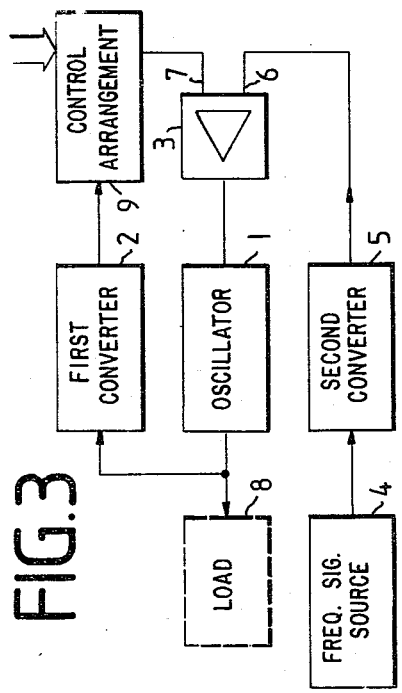
FIG. 1 is a block circuit diagram of a circuit arrangement of the type on which the invention is based.

FIG. 1 shows a known frequency control loop including the oscillator 1, the frequency/d.c. signal converter 2 and the comparator 3. In order to compensate for the adverse effects of the external operating conditions, such as temperature and operating voltage, on the converter characteristic, there is provided, according to FIG. 1, in addition to the known control loop, according to the invention, a frequency signal source 4 and a second frequency/d.c. signal converter 5. The frequency signal source 4 and the converter 5 serve to generate the control signal for the control loop. The frequency signal source 4 furnishes a frequency signal which is fed to the input of converter 5. From this frequency signal, the converter 5 generates at its output a d.c. signal which is the control signal for the control loop and is fed to the one input (6) of the comparator 3. The second input (7) of the comparator 3 receives the output signal of the first converter 2. Both input signals of the comparator are compared with one another in the comparator and the difference signal resulting from the comparison is amplified in comparator 3 and fed to the oscillator 1 as control signal (setting value). At its output, the oscillator 1 generates a frequency signal which serves to feed the load 8 and is additionally fed to the input of the first converter 2.

The operation of the circuit arrangement according to the invention can best be explained under consideration of the steady state of a control loop according to FIG. 1 including an oscillator 1, the converter 2 and the comparator 3 in which loop a frequency signal at constant frequency appears with unchanging control signal. If in this (steady) state the external operating conditions change, as for example the operating temperature or the operating voltage, the characteristic of the converter 2 of the control loop will change in an undesirable manner. This change in characteristic results in an undesirable change in frequency of the frequency signal of the control loop. However, this undesirable change in frequency is compensated, according to the invention, by the second converter 5 since under the condition that the second converter have the same characteristic as the first converter, the control signal generated by the second converter 5 changes in the same sense and in the same ratio as the output signal of the first converter 2 as a result of changes in the operating conditions. If such signals, which were changed in the same sense and in the same ratio, are compared with one another in the comparator 3, the signal changes resulting from a change in operating conditions will cancel one another out. Since in the steady state the difference between the input signals of the comparator 3 approaches zero, this state will remain in effect even if the two signals change in the same sense and in the same ratio. Consequently, the frequency generated by the oscillator remains constant in spite of the change in operating conditions.

Known frequency control loops serve to stabilize the frequency of the frequency signal generated by the oscillator of the control loop. Circuit arrangements having an additional (second) converter and an additional frequency signal source even increase the frequency stability and this for the reason that, as described above, changes in the characteristic of the converter of the control loop are compensated by the second converter. However, as already described, such a compensation requires that the second converter have as much as possible the same properties as the first converter of the control loop. This can be accomplished by a structure which is as identical as possible, i.e. the first and second converters should comprise the same components if possible.

An essentially identical structure of converters can be realized, for example, by way of monolithic integration, since components which are produced together in one and the same semiconductor body by means known in the semiconductor art (implantation, diffusion, epitaxy) have particularly closely coinciding properties if they are produced simultaneously and with the same processing methods. This applies mainly for components which are disposed on the semiconductor wafer in the immediate vicinity of each other. The two converters may have a common semiconductor body or separate semiconductor bodies in that, for example, the common semiconductor disc is subdivided. Or the converters may be produced, for example, in thick film and/or thin film technique, since this technique also permits the realization of coinciding properties for the converters. In the case where the converters are separated from one another, they should have a common substrate since a common substrate is the best assurance for identical temperature conditions.

Figure 2:
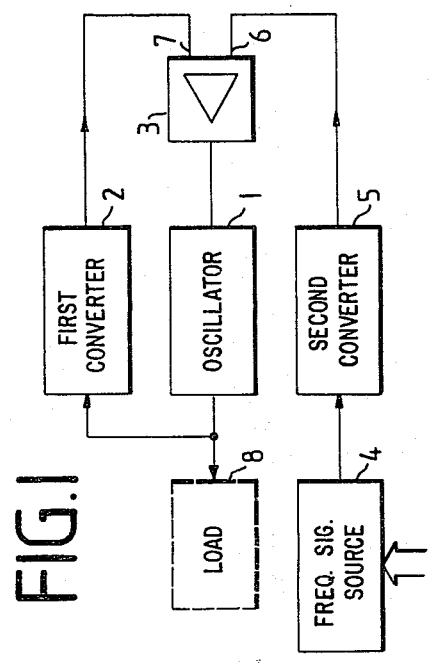

The arrangement of FIG. 2 differs from the arrangement of FIG. 1 in that between the second converter 5 and the comparator 3 there is connected a control arrangement 9. The control arrangement 9 serves to attenuate or amplify the output signal of the second converter 5. While in the arrangement of FIG. 1 a change in the control signal is possible only by way of a change in the frequency of the signal from the frequency signal source 4, the control arrangement of FIG. 2 offers an additional (second) way of controlling since the control arrangement 9 can be used to influence the direct signal furnished by the second converter 5. In the arrangement of FIG. 2, a change in the control signal is thus possible by changing the frequency of the frequency signal from the signal source 4, by changing by means of the control arrangement 9 the d.c. signal emitted by the second converter 5 or by a combination of these possible variations. Suitable control arrangements will be described later.

Figure 3:
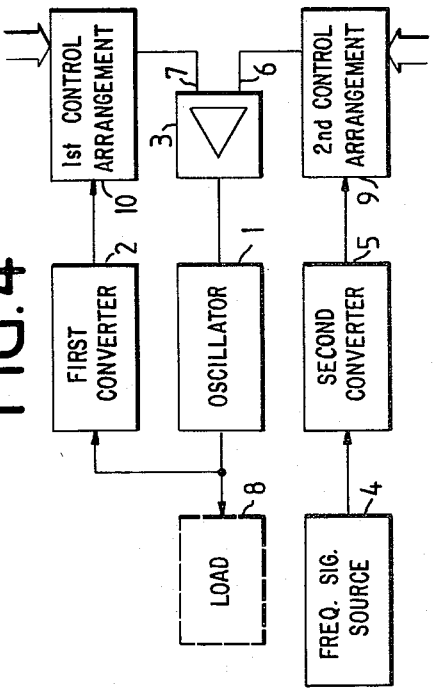

In the arrangement of FIG. 3, the control arrangement is not connected between the second converter 5 and the comparator 3 but between the comparator 3 and the first converter 2. In the arrangement of FIG. 3, the control arrangement 10 therefore does not vary the d.c. signal of the second converter 5 but the d.c. signal of the first converter 2.

Figure 4:
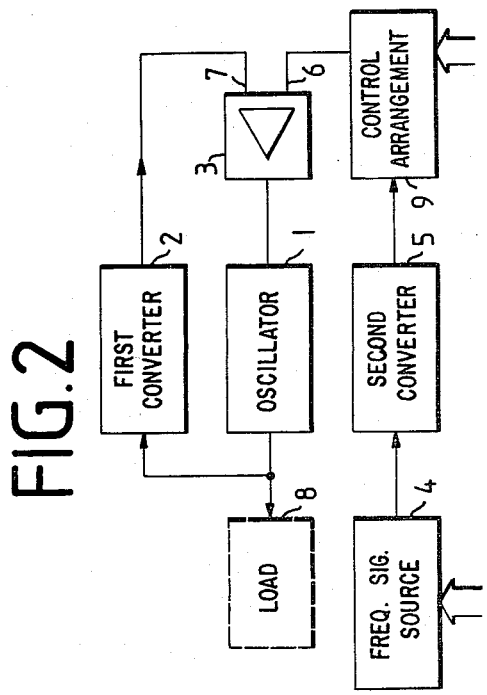

In the arrangement of FIG. 4 there are three possible variations, i.e. the possibility of varying the frequency of the signal from the frequency signal source 4, the possibility of varying the signal from the second converter 5 by means of the control arrangement 9 and the possibility of varying the signal from the first converter 2 by means of the control arrangement 10.

Figure 5:
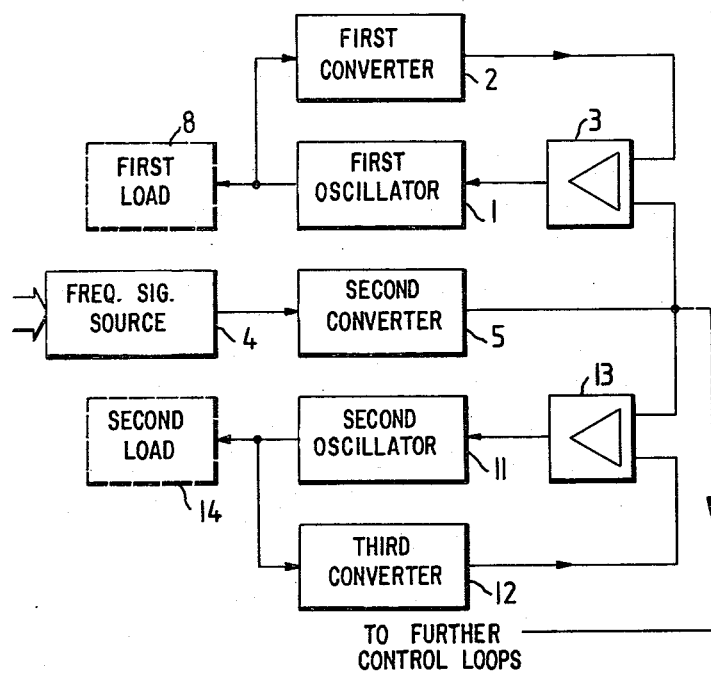

The arrangement of FIG. 5 has two frequency control loops. The first frequency control loop includes the first oscillator 1, the first converter 2 and the first comparator 3. The second frequency control loop includes the second oscillator 11, the third converter 12 and the second comparator 13. In addition to these two control loops, the arrangement of FIG. 5 is also provided with a control path including the frequency signal source 4 and the second converter 5. In the arrangement of FIG. 5, this control path furnishes the control signal for both control loops. The arrangement of FIG. 5 has the advantage that two frequency control loops can be controlled by a single control path. As indicated in FIG. 5, further control loops can of course also be controlled by the common control path (4, 5). Generally, the individual control loops or their oscillators, respectively, furnish different frequency signals which are transmitted to loads (8, 14). These frequency signals may also be transmitted to one common load.

Figure 6:
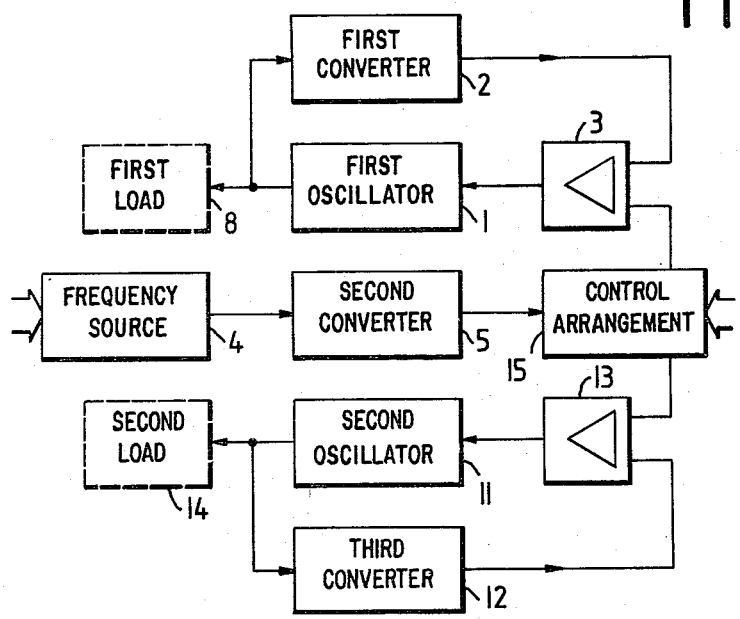

The arrangement of FIG. 6 differs from the arrangement of FIG. 5 in that an additional control arrangement 15 is provided in series with the control path (4, 5) so as to offer, as in the preceding arrangement, a d.c. signal variation in addition to the frequency variation. The control arrangement 15 may be designed and controlled in such a way that it influences either only one control circuit or both control circuits. The control arrangement may of course also influence more than two control circuits.

Figure 7:
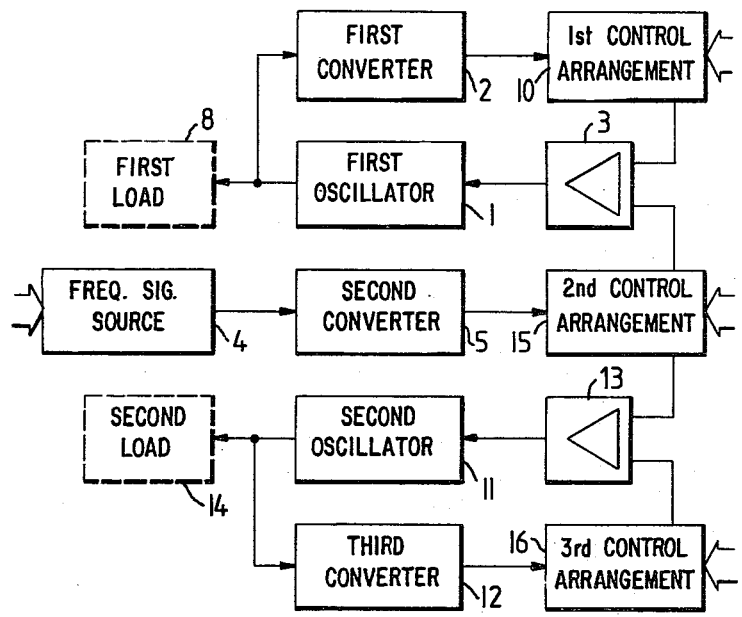

In the arrangement of FIG. 7, as in the arrangement of FIG. 4, control arrangements (10, 16) are additionally provided in the control loops to control the converter output signals.

The converters of FIGS. 1 through 7 are generally frequency/voltage converters or frequency/current converters. The frequency/voltage converters employed may be, for example, the known converter types VFC 32 (BURR BROWN), XR 4151 (EXAR), µA 4151 (FAIRCHILD), 9400 (TELEDYNE), A 8408 (INTECH) and XC 3315 (MOTOROLA). By connecting thereto a voltage/current converter, the known frequency/voltage converters can be made into frequency/current converters.

Figure 8:
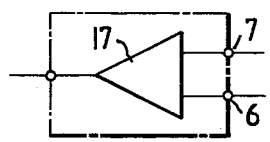
Figure 9:
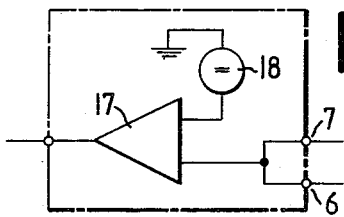

FIG. 8 shows a voltage comparator for use in the control circuits and FIG. 9 shows a current comparator. A voltage comparator is required if the control loop furnishes a direct voltage to the comparator. A current comparator is required if the control loop furnishes a direct current to the comparator. The voltage comparator of FIG. 8 includes a known operational amplifier 17 whose output signal depends on the potential difference between the inputs 6 and 7. The current comparator of FIG. 9 likewise includes an operational amplifier 17. In the current comparator of FIG. 9, the direct current coming from the control loop as well as the control signal coming from the control path (frequency signal source plus converter) or the control signal coming from the control arrangement, respectively, are fed to the same input of the operational amplifier 17. At the other input of the comparator there is connected a reference signal source 18 which furnishes any desired reference potential. The output voltage of the operational amplifier 17 depends, in the current comparator of FIG. 9, on the sum of the currents fed to the inputs 6 and 7 of the comparator.

Figure 10:
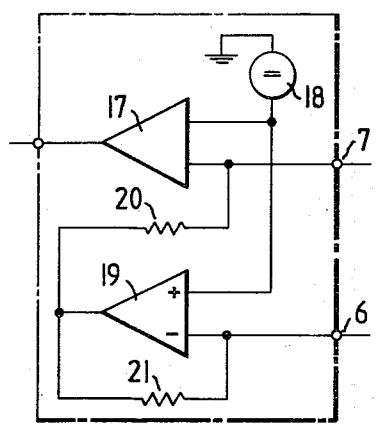

While in the arrangement of FIG. 9, the inputs 6 and 7 must receive oppositely directed currents, this is not necessary in the current comparator of FIG. 10 since in the arrangement of FIG. 10 the current fed to the input 6 is inverted by means of the inverter circuit including the inverter 19 and resistors 20 and 21.

Figure 11:
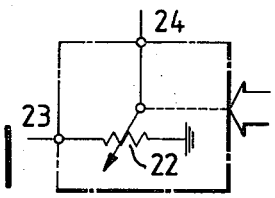
Figure 12:
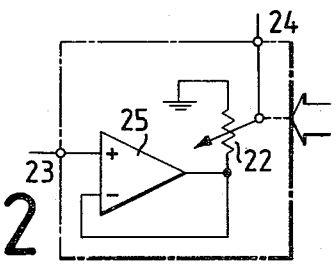
Figure 13:
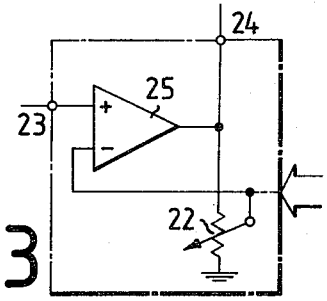

FIGS. 11 to 13 show basic shapes of control arrangements for voltage controlled control loops. As already expressed, there exist voltage reducing and voltage amplifying controls for regulating a voltage. FIGS. 11 and 12 show voltage reducing control arrangements. The control arrangement of FIG. 11 is a voltage divider 22. The input 23 is generally connected with the converter and the tap 24 is connected with the comparator.

While the arrangement of FIG. 11 is a passive control arrangement, the arrangement of FIG. 12 is an active control arrangement because in the arrangement of FIG. 12 there is provided, in addition to the voltage divider 22, an operational amplifier 25. This operational amplifier serves to decouple the voltage divider and the converter.

FIG. 13 shows an amplifying control arrangement including the voltage divider 22 and the operational amplifier 25.

FIG. 14 shows a control arrangement including an operational amplifier 25. The output signal of the converter is fed to the input 23 of the operational amplifier 25 and is amplified by the operational amplifier. The voltage divider 22 divides the output voltage of the operational amplifier 25. With the corresponding setting of the voltage divider 22, a voltage is obtained at its output 24 in the control arrangement which voltage is greater, equal to or less than the voltage at the input 23 of the operational amplifier.

The control arrangement of FIG. 15 includes a digital/analog converter 26 which serves as a digitally controlled potentiometer. The digital/analog converter receives at its input 23, as usual, a d.c. converter signal while the digital/analog converter is digitally controlled at the control input 27. The output signal is produced at the output 24.

FIGS. 16 to 18 show current controlled control arrangements. In these control arrangements, no voltage but a direct current is fed by the converter to the input 23 of the control arrangement. The arrangement of FIG. 16 includes an operational amplifier which serves as current/voltage converter. The operational amplifier 25 amplifies the potential difference generated at its input. Between the one input of the operational amplifier 25 and the output 24 of the control arrangement there is connected a resistance divider 22 whose tap is connected with the output of the operational amplifier 25. The voltage occurring at the output of the operational amplifier 25 generates, in the branch between output and input of the operational amplifier 25, a current which sets itself in such a way that it takes on the magnitude of the direct current fed to the input 23 and is directed oppositely to this direct current. This causes the potential difference at the input of the operational amplifier to approach zero. The voltage source 28 connected to the input of the operational amplifier 25 determines the potential at the input of the operational amplifier. This potential actually may be as desired. Preferably, however, this potential is equal to the potential furnished by the voltage source 18 of the comparators. The output current is determined by the resistance component lying between the output of the operational amplifier 25 and the output 24 of the control arrangement. This is the case only, however, if a comparator is connected to the output 24 of the control arrangement to correspond to the comparator of FIGS. 8 and 10.

In the control arrangement of FIG. 17, there is likewise provided an operational amplifier 25. Between its output and ground there is connected a resistance divider 22 whose tap is connected with the one input (23) of the operational amplifier 25. By setting that resistance which lies between the output of the operational amplifier and the tap of the resistance divider 22, the gain of the operational amplifier 25 is regulated. Between the input (23) of the operational amplifier 25 and ground there exists a potential difference which results in a current flowing through the resistance divider 22 to ground. This current influences the current at the output 24 of the control arrangement. The resistors 29 and 30 are codecisive for the output current and the gain of the operational amplifier.

The control arrangement of FIG. 18 has two outputs, namely the outputs 24 and 33. The variable resistor 31 is connected between output 24 and the output of the operational amplifier while the variable resistor 32 is connected between the output 33 and the output of the operational amplifier. As shown by the arrows, both resistors are controllable independently of one another. The control arrangement of FIG. 18 is able to control two control circuits separately.

Generally, frequency control loops should furnish signals at a constant frequency. For that purpose the frequency signal source furnishes a signal at a defined frequency. If a control arrangement is provided, the output signal of this control arrangement is selected so that the frequency control circuit (oscillator) furnishes the defined constant frequency.

However, there also exists the possibility of modulating the signals of the signal frequency source in such a way that a d.c. signal with superposed alternating signal appears at the output of the frequency/d.c. signal converter connected behind the signal frequency source. In this case, the frequency control circuits also furnishes modulated frequencies.

However, such a frequency modulation can also be realized with an alternating signal which is superposed over the d.c. signal(s) fed to the comparator. There of course also exists the possibility of combining the frequency modulation of the signal from the frequency signal source with the just described alternating signal superposition.

The drawing figures show broad arrows which have a symbolic meaning; i.e., these arrows are intended to express that the control arrangements are controlled externally. This control may be effected, for example, mechanically, electrically, optically or magnetically.

Figure 20:
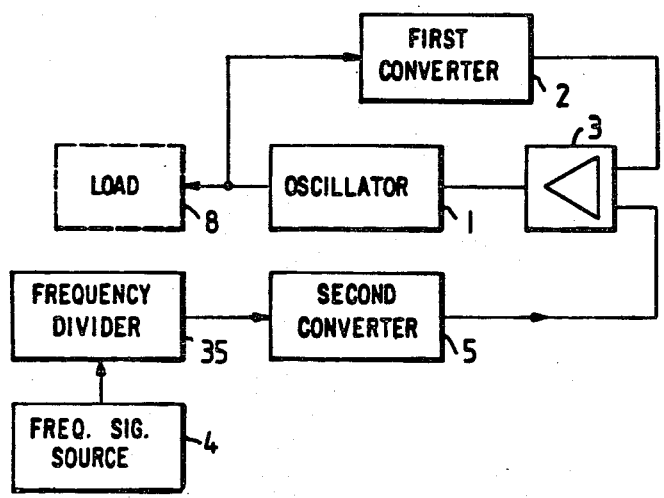
Figure 21:
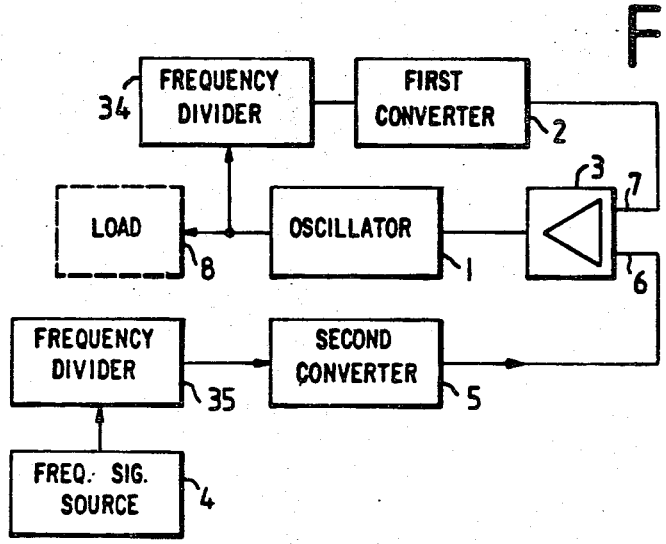

The circuit arrangements of FIGS. 19, 20 and 21 differ from the above-described circuit arrangements in that an additional way of controlling is provided, i.e., in the form of the frequency dividers 34 and 35. In the arrangement of FIG. 19, a frequency divider 34 is connected between the oscillator 1 and the converter 2 of the frequency control loop. This frequency divider 34 can also be used to control the oscillator frequency of the frequency control loop.

In the arrangement of FIG. 20, a frequency divider 35 is connected between the frequency signal source 4 and the converter 5 of the control path so that the additional frequency regulation is effected by the frequency divider in the control path.

The arrangement of FIG. 21 represents a combination of the possibilities shown in FIGS. 19 and 20; in the arrangement of FIG. 21, two frequency dividers (34, 35) are provided; one of which (34) is disposed in the frequency loop and the other (35) is disposed in the control path.

A circuit arrangement according to the invention, as already expressed, is used to generate stable frequency signals. Such frequency signals are required, for example, in the oscillator tuning circuits of receivers. The invention is therefore used to advantage in oscillator tuning circuits.

Oscillator tuning circuits are used, for example, in receiver circuits of radio and television receivers. Presently, more and more electronic tuning means are being used. In an electronic tuning system which operates, for example, with varactor diodes, there should exist as linear a relationship as possible between the control voltage and the oscillator frequency in order to obtain a linear frequency scale in the display of the control voltage for the tuning diode.

Figure 22:
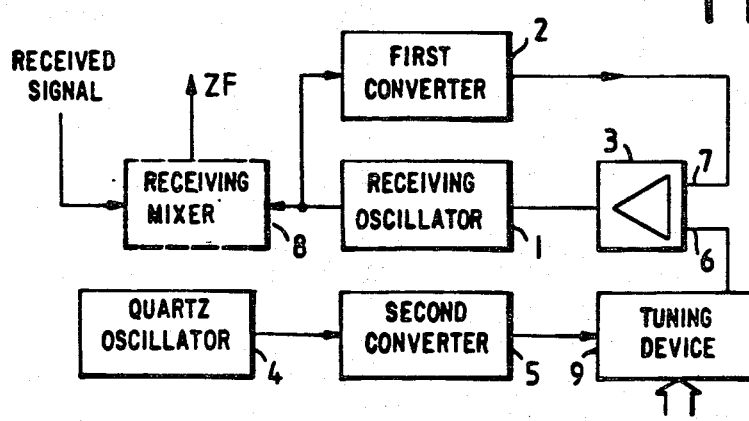

FIG. 22 shows an oscillator tuning circuit according to the invention in which the desired linear relationship between the control signal and the oscillator frequency generated in the control loop does exist. The oscillator tuning circuit of FIG. 22 provides the additional advantage that it furnishes stable frequency signals at relatively low expense.

The oscillator tuning circuit of FIG. 22 includes a frequency control loop and a control path. The oscillator 1 of the frequency control loop is the receiving oscillator of the receiver. The frequency generated by the receiving oscillator 1 constitutes the superheterodyne frequency which is fed to the receiving mixer 8. The received signal is fed to the other input of the receiving mixer 8. The superheterodyne frequency signal and the received signal are mixed in the receiving mixer 8 and produce at the output of the receiving mixer the intermediate frequency signal. In addition to the receiving oscillator, the frequency control loop also includes a converter 2 and the comparator 3.

The control signal for the frequency control loop is generated by the quartz oscillator 4, the second converter 5 and the tuning device 9 which corresponds to the control arrangement. The quartz oscillator 4 furnishes a constant frequency. The control signal is varied by the tuning device 9 which is, for example, a tuning potentiometer. The elements of the oscillator tuning circuit, such as the converter, comparator, and control arrangement, are designed as described above.

We claim:

1. In a circuit arrangement including at least one control loop composed of a controllable oscillator for producing an a.c. output signal whose frequency is a function of the value of a control signal thereto, a frequency/d.c. signal converter connected for producing a d.c. output signal which is a function of the frequency of the oscillator output signal, a signal comparator having two inputs and an output, first signal conducting means connected for applying to one comparator input a signal corresponding in value to the converter output signal, and connecting means connected for applying to the oscillator a control signal corresponding to the signal at the comparator output, the circuit arrangement further including an a.c. signal source, a second frequency/d.c. signal converter connected for producing a d.c. output signal which is a function of the frequency of the a.c. signal produced by the source, and second signal conducting means connected for applying to the other comparator input a signal corresponding in value to the second converter output signal, the improvement wherein there are at least two said control loops, and said second conducting means comprises adjustable signal control means connected between the output of said second converter and the other input of said comparator of each said loop for applying to each said associated comparator input a signal which differs in value from and varies in proportion with the output signal from said second converter.

2. Circuit arrangement according to claim 1 characterized in that said signal control means comprise a signal amplifier having a controllable gain.

3. Circuit arrangement according to claim 1 characterized in that said signal control means comprise a signal amplitude divider having a controllable dividing ratio.

4. In a circuit arrangement including at least one control loop composed of a controllable oscillator for producing an a.c. output signal whose frequency is a function of the value of a control signal thereto, a frequency/d.c. signal converter connected for producing a d.c. output signal which is a function of the frequency of the oscillator output signal, a signal comparator having two inputs and an output, first signal conducting means connected for applying to one comparator input a signal corresponding in value to the converter output signal, and connecting means connected for applying to the oscillator a control signal corresponding to the signal at the comparator output, the circuit arrangement further including an a.c. signal source, a second frequency/d.c. signal converter connected for producing a d.c. output signal which is a function of the frequency of the a.c. signal produced by the source, and second signal conducting means connected for applying to the other comparator input a signal corresponding in value to the second converter output signal, the improvement wherein said second conducting means comprises adjustable signal control means connected between the output of said second converter and its associated comparator input for applying to said associated comparator input a signal which differs in value from and varies in proportion with the output signal from said second converter, and said adjustable signal control means comprise a digital/analog converter having a signal input connected to receive the output signal from said second converter and having a control input connected to receive a digital signal.

5. In a circuit arrangement including at least one control loop composed of a controllable oscillator for producing an a.c. output signal whose frequency is a function of the value of a control signal thereto, a frequency/d.c. signal converter connected for producing a d.c. output signal which is a function of the frequency of the oscillator output signal, a signal comparator having two inputs and an output, first signal conducting means connected for applying to one comparator input a signal corresponding in value to the converter output signal, and connecting means connected for applying to the oscillator a control signal corresponding to the signal at the comparator output, the circuit arrangement further including an a.c. signal source, a second frequency/d.c. signal converter connected for producing a d.c. output signal which is a function of the frequency of the a.c. signal produced by the source, and second signal conducting means connected for applying to the other comparator input a signal corresponding in value to the second converter output signal, the improvement wherein said second conducting means comprises adjustable signal control means connected between the output of said second converter and its associated comparator input for applying to said associated comparator input a signal which differs in value from and varies in proportion with the output signal from said second converter, and said adjustable signal control means comprises a current controlled control arrangement which includes an operational amplifier having two inputs and an output, a resistance divider having a tap, and a voltage source, with said resistance divider being connected between one input of said operational amplifier and the output of said control arrangement, the tap of said resistance divider being connected to the output of said operational amplifier, and said voltage source furnishing a potential to the other input of said operational amplifier.

6. In a circuit arrangement including at least one control loop composed of a controllable oscillator for producing an a.c. output signal whose frequency is a function of the value of a control signal thereto, a frequency/d.c. signal converter connected for producing a d.c. output signal which is a function of the frequency of the oscillator output signal, a signal comparator having two inputs and an output, first signal conducting means connected for applying to one comparator input a signal corresponding in value to the converter output signal, and connecting means connected for applying to the oscillator a control signal corresponding to the signal at the comparator output, the circuit arrangement further including an a.c. signal source, a second frequency/d.c. signal converter connected for producing a d.c. output signal which is a function of the frequency of the a.c. signal produced by the source, and second signal conducting means connected for applying to the other comparator input a signal corresponding in value to the second converter output signal, the improvement wherein said second conducting means comprises adjustable signal control means connected between the output of said second converter and its associated comparator input for applying to said associated comparator input a signal which differs in value from and varies in proportion with the output signal from said second converter, and said adjustable signal control means comprise a current controlled control arrangement which includes an operational amplifier having two inputs and an output, a resistance divider having a tap, a voltage source and a resistor, with said resistance divider being connected between the output of said operational amplifier and ground, the tap of said resistance divider being connected to one input of said operational amplifier, said voltage source being connected to the other input of said operational amplifier, and said resistor being connected in series between the output of said operational amplifier and the output of said control arrangement.

7. In a circuit arrangement including at least one control loop composed of a controllable oscillator for producing an a.c. output signal whose frequency is a function of the value of a control signal thereto, a frequency/d.c. signal converter connected for producing a d.c. output signal which is a function of the frequency of the oscillator output signal, a signal comparator having two inputs and an output, first signal conducting means connected for applying to one comparator input a signal corresponding in value to the converter output signal, and connecting means connected for applying to the oscillator a control signal corresponding to the signal at the comparator output, the circuit arrangement further including an a.c. signal source, a second frequency/d.c. signal converter connected for producing a d.c. output signal which is a function of the frequency of the a.c. signal produced by the source, and second signal conducting means connected for applying to the other comparator input a signal corresponding in value to the second converter output signal, the improvement wherein there are at least two said control loops, said second conducting means comprises adjustable signal control means connected between the output of said second converter and the other input of said comparator of each said loop for applying to each said associated comparator input a signal which differs in value from and varies in proportion with the output signal from said second converter, and said adjustable signal control means comprise a control arrangement having at least two outputs each connected to the other input of said comparator of a respective loop, said control arrangement including an operational amplifier having two inputs and an output, a voltage source, two variable resistors and a further resistor, with the output of said operational amplifier being connected via one of said two variable resistors with one output of said control arrangement and via the other one of said two variable resistors with a second output of said control arrangement, one input of said operational amplifier being connected via said further resistor to the output of said operational amplifier, and said voltage source being connected to the other input of said operational amplifier.

* * * * *